US006876259B2

(12) United States Patent
Visocchi

(10) Patent No.: US 6,876,259 B2
(45) Date of Patent: Apr. 5, 2005

(54) FULLY INTEGRATED RECEIVED SIGNAL STRENGTH INDICATOR FOR A TRANSIMPEDANCE AMPLIFIER

(75) Inventor: Pasqualino Michele Visocchi, Barnet (GB)

(73) Assignee: Gennum Corporation, Burlington (CA)

( * ) Notice: Subject to any disclaimer, the term of this patent is extended or adjusted under 35 U.S.C. 154(b) by 5 days.

(21) Appl. No.: 10/654,970

(22) Filed: Sep. 5, 2003

(65) Prior Publication Data

US 2005/0052246 A1 Mar. 10, 2005

(51) Int. Cl.⁷ ............................................. H03F 3/08
(52) U.S. Cl. ................................. 330/308; 250/214 A
(58) Field of Search ...................... 330/308, 69, 124 R, 330/85, 98; 250/214 A

(56) References Cited

U.S. PATENT DOCUMENTS 6,342,694 B1 * 1/2002 Satoh ..................... 250/214 A
6,552,605 B1 * 4/2003 Yoon ............................. 330/9
6,803,825 B2 * 10/2004 Chiou et al. ................ 330/308

* cited by examiner

*Primary Examiner*—Henry Choe
(74) *Attorney, Agent, or Firm*—Kenyon & Kenyon

(57) ABSTRACT

A transimpedance amplifier (TIA) circuit and received signal strength indicator (RSSI) circuit are provided on a same integrated circuit substrate for providing of a TIA output signal and a RSSI signal. The RSSI signal is being used as an indication of optical alignment when aligning of an optical fiber to a photodetector coupled with the TIA during optical receiver manufacture or as received optical signal strength during operation. This allows for the TIA and RSSI circuit to be disposed within an optical signal receiver module prior to optical alignment. The TIA overcomes limitations of the prior art by allowing for a 2V reverse bias voltage to be provided on a PIN diode when the PIN diode is used with a single ended 3.3V supply voltage.

36 Claims, 5 Drawing Sheets

FULLY INTEGRATED RECEIVED SIGNAL STRENGTH INDICATOR FOR A TRANSIMPEDANCE AMPLIFIER

FIELD OF THE INVENTION

The invention relates to the field of received signal strength indicator circuits and more specifically in the field of received signal strength indicator circuits integrated with transimpedance amplifier circuits.

BACKGROUND OF THE INVENTION

The ever increasing demands for high capacity communications systems has resulted in a wide spread deployment of optical fiber networks across the world. A fundamental component used in such systems receives pulses of light and converts these into electrical signals. The pulses of light in such systems comprise a bit stream of information. This fundamental component employed in fiber optic networks is commonly known as an optical receiver module. Within the optical receiver, a photodetector is typically employed to receive light pulses and an amplifying circuit is employed for amplifying photocurrent generated within the photodetector.

Transimpedance amplifiers (TIAs) are typically used within optical receiver modules to amplify and transform weak photocurrents received from the photodetector, typically a photodiode or a PIN diode. The TIA amplifies and transforms the photocurrent into an output voltage that is further provided to other stages of the optical receiver module. Since TIAs are used to deal with both strong and weak photocurrents, noise in the resultant amplified and transformed voltage signal is typically a problem. Indeed, for those skilled in the art of the design of TIAs, it is well understood and appreciated that the noise introduced by the TIA, in many circumstances, limits the ability of the optical receiver module to faithfully reconstruct the intended stream of information. Furthermore, a relationship between the rate at which errors are produced by the receiver—often called the Bit Error Rate (BER), and the noise generated by the TIA can be shown. Thus, the optical receiver module needs to have low noise amplification performed on weak photocurrents in order to facilitate optical transmission of information. This is especially true in circumstances where the distance that the optical signal must travel is long and results in weak optical pulses at the receiver. It is known to those skilled in the art that long transmission distances—the distance between a transmitter and a receiver—serves to attenuate the initial transmitted optical signal strength and places a greater burden upon the receiver module to avoid errors. Furthermore, it is also known that cost of an optical communication system is reduced if a signal is transmitted along a longer length of optical fiber or, in the alternative, if less optical power is transmitted. Thus, providing low noise amplification for the TIA is important in order to reduce bit error rate (BER) of the received and amplified signal.

In optical receiver systems, the photodiode and TIA are typically co-packaged within a single module. After co-packaging, once the position of the photodiode is fixed in relation to a housing of the received module, an optical fiber is aligned to the photodiode in order to provide the pulses of light propagating in the optical fiber to the photodiode. Proper optical alignment of the optical fiber to the photodiode is critical in order to minimize optical coupling loss therebetween and in order to utilize a full dynamic range of the photodiode and TIA coupled therewith. In performing of optical alignment of the optical fiber to the photodiode, light is typically propagated through the optical fiber and a signal indicative of the quality of the alignment is provided from the TIA in order to obtain optimal positional alignment of the optical fiber.

In performing of this optical alignment, the light incident upon the photodiode always has a mean DC component and this DC component represents the mean signal strength of the optical signal as received by the photodetector and amplified by the TIA. Typically, the signal indicative of the quality of the alignment is in the form of a Received Signal Strength Indicator (RSSI) signal provided from an RSSI output port on the TIA. A magnitude of the RSSI signal represents the mean optical signal strength, which is used to align the photodiode detector to the optical fiber within the receiver module to achieve maximum responsivity during the manufacturing process or to provide an analog indication of the mean optical power incident upon the receiver for further processing during operation. This RSSI represents the mean DC current, or ratio of current, flowing through the photodiode detector into an input port of the TIA.

Often circuits that provide the RSSI signal are implemented externally from the TIA and are disposed in such a manner so as to monitor the DC current flowing at the cathode of a photodiode detector. This method unfortunately reduces the reverse bias voltage if a PIN diode detector is used. For single ended power supply operation this proves to be a problem, especially when 3.3V single ended power supply voltages are used.

An alternative approach to providing of the RSSI signal is to rectify the TIA output signal from the TIA and provide a Root Mean Squared (RMS) component of this signal that is representative of the RSSI. This, however, is not a true RSSI, since most TIAs exhibit automatic gain control (AGC) or signal limiting within the full optical dynamic range of the TIA and thus the RSSI is not a true representation of the DC current flowing through the photodetector and into the TIA.

A need therefore exists to provide a RSSI circuit that is representative of the coupling of the optical fiber to the photodiode without a reduction in the reverse bias voltage provided to the photodiode. It is therefore an object of the invention to provide an integrated RSSI circuit integrated with the TIA that does not reduce the reverse bias voltage when used with a photodetector in the form of a PIN photodiode. Furthermore, it is an object of the invention to provide an integrated RSSI circuit that can operate from the same voltage supply used by TIA. Furthermore, it is an object of the invention to provide an integrated RSSI circuit integrated with the TIA that does not introduce a sensitivity penalty due to a DC voltage offset between the active TIA and the reference TIA.

SUMMARY OF THE INVENTION

In accordance with the invention there is provided a circuit for coupling to a photodetector for providing a received signal strength indicator (RSSI) signal comprising: a transimpedance amplifier (TIA) stage coupled to the photodetector for receiving current flowing therethrough and for providing a TIA output signal; a filter circuit having an input port for receiving the TIA output signal and for filtering the TIA output signal to provide a first voltage signal; a dummy TIA stage having a dummy TIA output port for providing a second DC voltage signal; a high gain integrator circuit having a negative input port for receiving the second DC voltage signal, having a positive input port for receiving the first voltage signal and having an output port for providing a high gain integrator output signal therefrom; a transconductance amplifier (TCA) circuit having a negative input port for receiving the second DC voltage signal, having a positive input port for receiving the first voltage signal, and having an output port for providing a first current therefrom; and a second current mirror having an input port for receiving the first current and a second current and for providing the RSSI signal from an output port thereof, the RSSI signal dependent upon the first and second currents.

In accordance with the invention there is provided a method of providing a RSSI signal from a circuit coupled to a photodiode comprising the steps of: propagating a photodiode current through the photodiode; providing a transimpedance amplifier (TIA) circuit for providing of a TIA output signal in dependence upon receiving of the photodiode current from the photodiode; adjusting a first bias voltage; providing a first current in dependence upon the photodiode current and the first bias voltage; providing a second current in dependence upon the photodiode current and the first bias voltage; and, summing the first and second currents to provide an added current, where the RSSI signal is dependent thereon.

BRIEF DESCRIPTION OF THE DRAWINGS

Exemplary embodiments of the invention will now be described in conjunction with the following drawings, in which.

DETAILED DESCRIPTION THE INVENTION

Figure 1A:
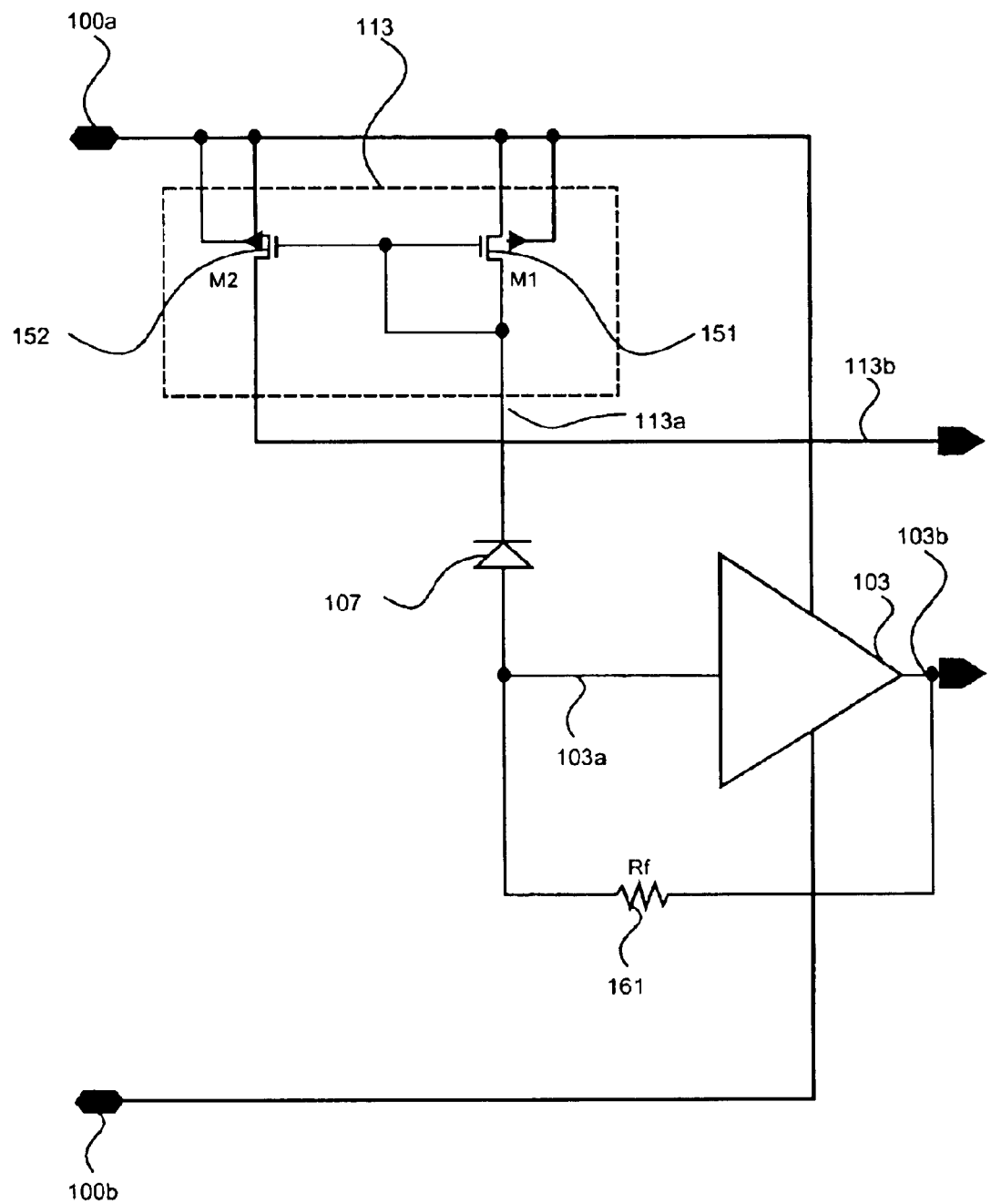
FIG. 1a illustrates common, prior art, circuit used for providing a RSSI signal from a circuit that operates with a single positive supply voltage.

FIG. 1a illustrates a common, prior art, circuit used for providing a RSSI signal. In this circuit, a current mirror 113, formed from MOSFETS M1 151 and M2 152 is coupled in series with a cathode terminal of a photodiode 107. An output port 113b of the current mirror 113 is used for providing the RSSI signal therefrom. A P-channel MOSFET M1 151 is disposed in a diode configuration, with a gate terminal of MOSFET M1 151 connected to a gate terminal of MOSFET M2 152 to provide a gate-source potential having a sufficient magnitude for enabling of the P channel MOSFET M2 152 to act as a first current source. If the geometry of MOSFETs M1 151 and M2 152 are the same, the current at the drain terminal of MOSFET M1 151 is equal to the drain current of MOSFET M2 152. This drain current, emitted from the current mirror output port 113b, provides the RSSI signal having a one to one relationship with a DC photodiode current propagating through the photodiode 107. A transimpedance amplifier (TIA) circuit 103 is provided with a TIA input port 103a connected to the photodiode 107 anode terminal and a TIA output port 103b for providing an output signal. A first feedback resistor 161 is disposed between the TIA input port 103a and the TIA output port 103b establishing a gain of the TIA 103. A first supply voltage input port 100a is provided for receiving a positive supply voltage (Vpos) and a second supply voltage input port 100b is provided for receiving a negative supply voltage (Vneg) for energizing of the current mirror 113 and the TIA 103. The negative supply voltage (Vneg) is for receiving a ground voltage.

The supply voltage, Vpos, provided to the fist voltage supply input port 100a, is 3.3V and the potential drop across the source-drain terminals of MOSFET M1 151 is marginally higher than the threshold voltage of MOSFET M2 152. Of course, this is dependent upon geometry of the MOSFETs and the drain current of MOSFET M1 151. This potential drop across the source-drain terminals of MOSFET M1 151 unfortunately lowers the reverse bias voltage available to the photodiode 107. Lowering of the reverse bias voltage unfortunately decreases the dynamic range operation of the photodiode 107 especially at long wavelengths (1300–1500 nm) and at high optical data rates (10 Gbit/s). Typically for these wavelengths and optical data rates, photodiode operation with a 2V reverse bias voltage is preferred.

Of course, if the TIA is optionally designed to operate at 5V and to provide an input bias voltage that is as low as possible, approximately one Vbe, in which case the addition of the current mirror 113 formed by MOSFETS M1 151 and M2 152 would not substantially reduce the reverse bias voltage provided to the photodiode 107.

Figure 1B:
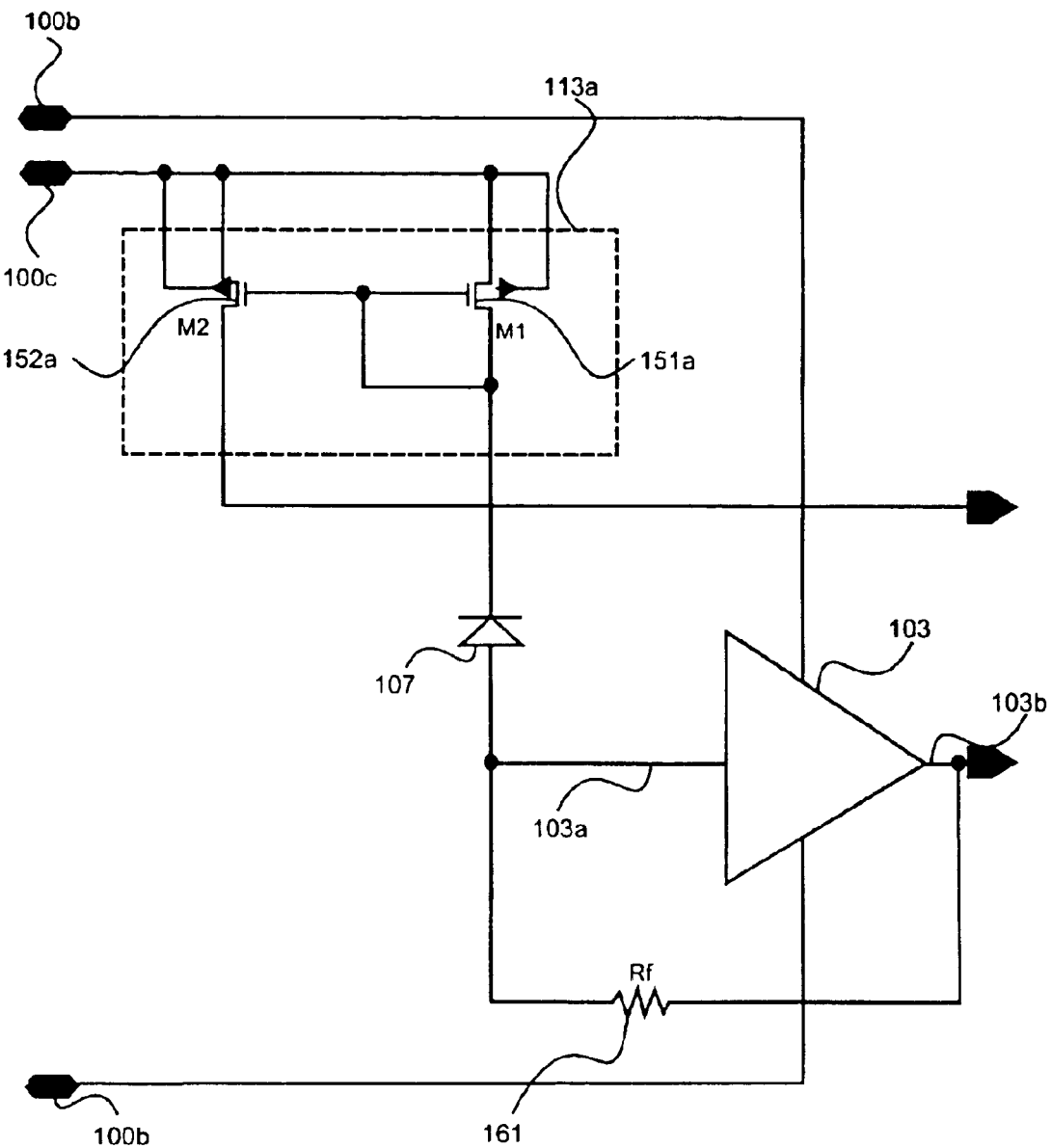
FIG. 1b illustrates common, prior art, circuit used for providing a RSSI signal from a circuit that operates using two positive supply voltages.

An alternative circuit used for providing additional reverse bias voltage to the photodiode 107 is shown in prior art FIG. 1b, which is a variation of the circuit shown in FIG. 1a. In this variation, the TIA 103 operates using a potential received from the first voltage supply input port 100b, and operates using a Vpos2=3.3V supply voltage. A third supply voltage input port 100c is provided for providing a higher potential than Vpos2, where Vpos1=5V. Vpos1 is provided to the current mirror 113a, formed from MOSFETs M1 151a and M2 152a, for reverse biasing of the photodiode 107 using this separate supply voltage, Vpos1. Similar to that of FIG. 1a, the current mirror 113a provides the RSSI signal. By using two positive supply voltages, Vpos2 and Vpos1, the reverse bias voltage of the photodiode 107, in the form of a PIN diode, is advantageously not lowered, as is the case in FIG. 1a. However this is accomplished at the expense of utilizing two positive supply voltages. In addition, if the photodiode is in the form of an avalanche photodiode detector (APD), the cathode is coupled to a separate supply positive voltage supply of approximately 55–60V, in which case the circuit shown in FIG. 1a is not useable. In using the circuit shown in FIG. 1b, external P-MOSFET devices are used when this circuit is used in conjunction with an APD.

Figure 2:
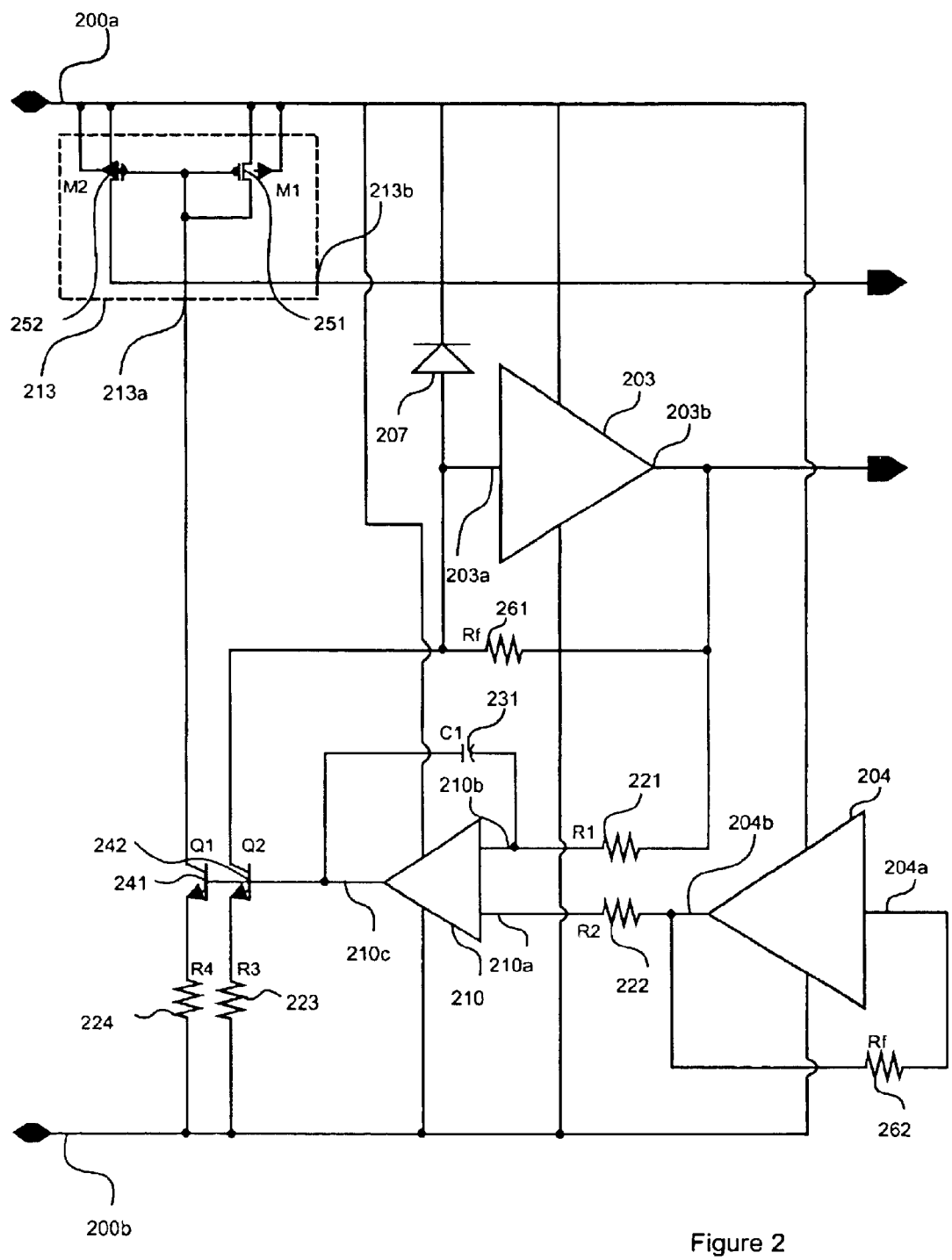
FIG. 2 illustrates an alternative circuit for providing a RSSI signal by implementing a DC restoration control loop.

FIG. 2 illustrates a circuit for providing a RSSI signal by implementing a DC restoration control loop. The output port 203b of a TIA stage 203 is coupled to a negative input port 210b of an operational amplifier (OpAmp) 210, via a resistor R1 221. The OpAmp 210 is configured as an integrator, with a capacitor C1 231 connected between an OpAmp output port 210c and an OpAmp negative input port 210b. A first feedback resistor 261 is coupled from the TIA output port 203b to the TIA input port 203a.

A dummy TIA stage 204 is used to provide a same DC output voltage as a DC output voltage of the TIA 203, via a resistor R2 222, to a positive input port of the OpAmp 210. The resistors R1 221 and R2 222 are designed to be equal in value to minimize DC voltage offsets between the positive and negative input signals received on the input ports 210a and 210b of the OpAmp 210. The output port of the integrator circuit 210c, which is the OpAmp output port 210c, is coupled to a voltage controlled current source formed by transistor Q2 242 and resistor R3 223. The collector terminal of transistor Q2 242 is connected to the TIA input port 203a and to the anode of the photodiode 207. Since the TIA 203 and dummy TIA 204 stages are identical, the DC potential difference between the input ports of the integrator circuit, which are the input ports of the OpAmp 210, are zero, and thus no current flows into the collector terminal of transistor Q2 242.

Upon an application of an unmodulated optical signal to the photodiode, the unmodulated optical signal causes a shift in the DC level of a current flowing through the photodiode and into the TIA input port. This results in an input signal provided to the negative input port 210b of the integrator circuit (210 and 231) to be less than the input signal provided to the positive input port 210a, resulting in the integrator circuit (210 and 231) causing a current to be provided at the collector terminal of transistor Q2 242 to be equal to the DC current flowing through the photodiode 207 and into the TIA input port 203a.

The TIA output signal is thus 'clamped' and has a DC output signal level that is the same as that of the durnny TIA stage output signal DC level. By providing a current mirror formed from transistor Q1 241 and resistor R4 224, an exact replica, or portion, of the current at the collector terminal of transistor Q2 242 appears at the collector terminal of transistor Q1 241. This collector current is applied to a second current mirror 213 formed from P channel MOSFETs M1 251 and M2 252, where the drain terminal of MOSFET M2 252 serves as an RSSI signal output port for providing of the RSSI signal.

The circuit for generating of the RSSI signal shown in FIG. 2 operates in response to a 3.3V supply without reducing the photodiode's reverse bias voltage, and in addition, also operates if the photodiode is an APD, which requires an external bias voltage of 55–60V. However, in practice, DC voltage mismatches between the TIA output signal and the dummy TIA output signal cause a DC voltage offset to be observed between the output ports of the TIA and the dummy TIA.

If TIA output signal DC voltage is marginally more negative than the DC output voltage at the dummy TIA, this causes the collector current of transistor Q2 242 to flow into the TIA input port 203a and to clamp the DC voltage output signal of the TIA stage 203. This clamping results in the DC output signal level of the dummy TIA stage 204 to be equal to the DC voltage output of the TIA stage 203, thus causing a noise penalty due to additional shot noise from the collector current of transistor Q2 242.

Figure 3:
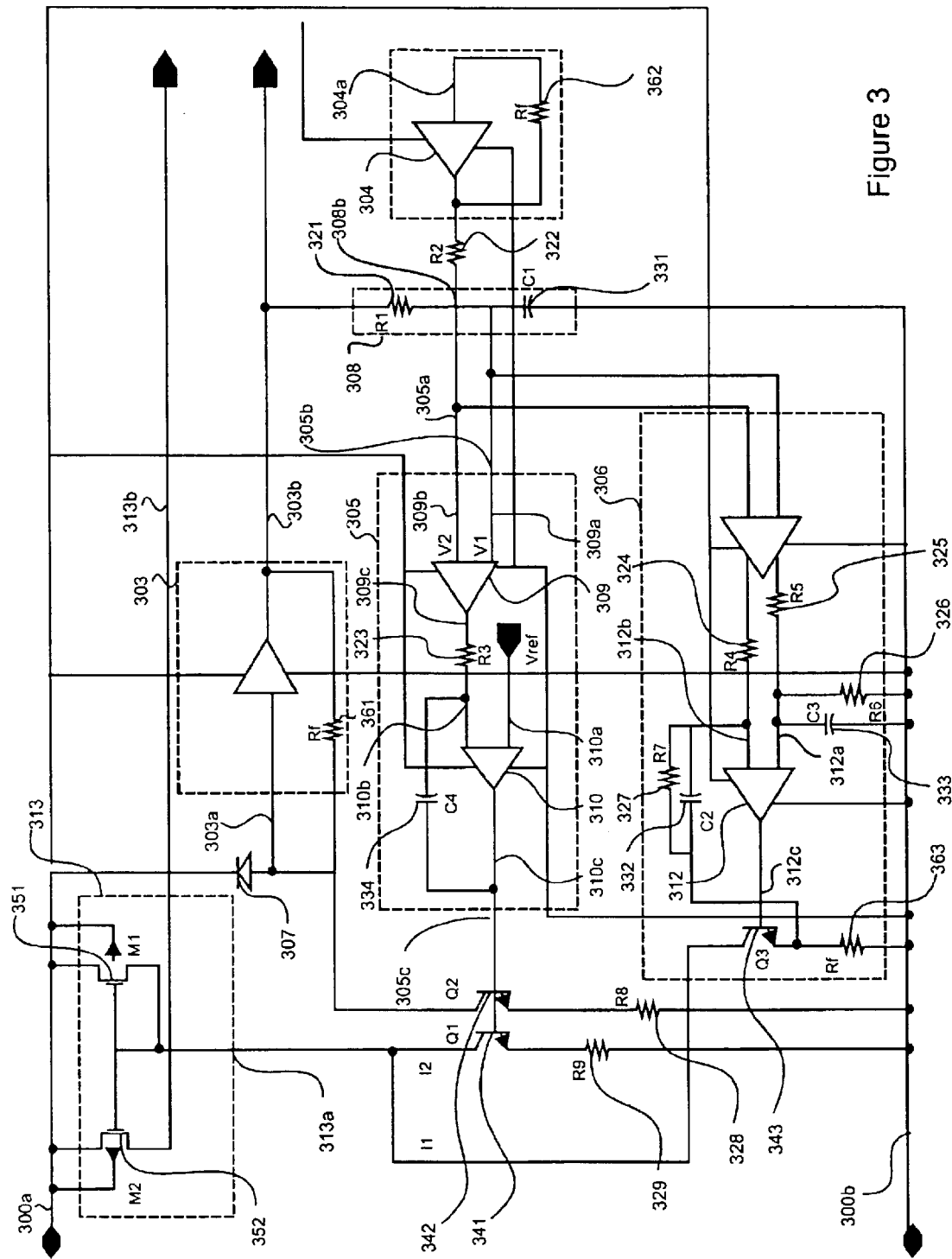
FIG. 3 illustrates a circuit architecture used for generating a RSSI signal in accordance with an embodiment of the invention; and, FIG. 4 graphically illustrates the RSSI output signal, in the form of RSSI output current, with respect to a mean photodiode output current.

FIG. 3 illustrates a circuit architecture used for generating a RSSI signal in accordance with an embodiment of the invention. The circuit shown in FIG. 3 is comprised of four main circuit blocks. These circuit blocks are a TIA stage 303, a Dummy TIA stage 304, a High Gain Integrator (HGI) circuit 305 and a Transconductance Amplifier (TCA) circuit 306. A first supply voltage input port 300a is provided for receiving a Vpos voltage, where each of the circuit blocks are connected to the first supply voltage input port 300a for receiving of Vpos, and a second supply voltage input port 300b is provided for receiving of a preferably ground voltage, where each of the circuit blocks are connected to these supply voltage input ports for energizing of circuitry within the circuit blocks. A photodiode 307 is coupled with its anode terminal to a TIA input port 303a, while its cathode terminal is coupled to the first supply voltage input port 300a. A first feedback resistor 361 is disposed between the TIA input port 303a and a TIA output port 303b. The TIA output port 303b is coupled to a filter input port 308a of a filter circuit 308 in the form of a low pass filter circuit formed by resistor R1 321 and capacitor C1 331. Capacitor C1 331 functions as a filter capacitor within the low pass filter circuit. A filter circuit output port 308b is coupled to a positive input port 309a of a first differential amplifier 309, disposed within the HGI 305, via a second HGI input port 305a, for providing a filtered output signal, in the form of first voltage signal (V1) thereto. A second feedback resistor 362 is disposed between a dummy TIA stage input port 304a and a dummy TIA stage output port 304b. A DC output signal is provided from the dummy TIA stage 304 from the dummy TIA stage output port 304b to a negative input port 309b of the differential amplifier 309, via a first HGI input port 305b and a resistor R2 322, for providing a second DC voltage signal (V2) to the first differential amplifier 309. This second DC voltage signal (V2) is provided under a condition when the photodiode 307 receives approximately no light. The resistors R1 321 and R2 322 are designed to have equal resistances in order to minimize DC voltage offsets occurring due to the positive and negative input bias currents of the first differential amplifier 309. A first differential amplifier output signal is provided from the first differential amplifier 309 via a resistor R3 323 to a negative input port of a first OpAmp 310b. The first differential amplifier 309 provides an output signal that is a difference voltage between V1, the input signal on port 305b, and V2, the input signal on port 305a. This output signal is adjustable, by adjusting a first bias signal, for providing unity gain.

This difference voltage is applied to a negative input port 310b of a first operational amplifier (first OpAmp) 310 via a resistor R3 323 and capacitor C4 334. The first OpAmp, third resistor 323 and fourth capacitor 334 are disposed in an integrator configuration. An output port 310c of the first OpAmp 310 is coupled to the High Gain Integrator output port 305c for providing a HGI output signal therefrom.

The HGI output port 305c is connected to a voltage controlled second current source formed by transistor Q2 342 in series with a resistor R8 328 disposed between the emitter terminal and the second supply voltage input port 300b. The collector terminal of transistor Q2 342 is also coupled to the anode terminal of the photodiode 307. This connection to the anode terminal of the photodiode 307, and thus to the input port 302a of the TIA 203, provides a DC feedback path in this closed loop configuration.

A positive input port 310a of the first Op-Amp 310 is for receiving of the first bias signal. A voltage of this first bias signal is used to predetermine a reference voltage (Vref) for the first Op-Amp 310 for resulting in a light intensity incident upon the photodiode 307 to be sufficiently above a noise floor before a collector current of transistor Q2 342 is used to 'clamp' a DC portion of the TIA output signal provided from the TIA output port 303b. The base terminal of transistor Q2 342 is additionally connected to a first current mirror circuit formed by transistor Q1 341 and resistor R9 329 disposed between an emitter terminal of transistor Q1 341 and the second supply voltage input port 300b. The first current mirror, generating a current I2 is of such a configuration that the collector current of transistor Q1 341 is preferably equal to the collector current of transistor Q2 342.

The potentials V1 and V2 are also applied to first and second TCA input ports 306a and 306b. A second difference amplifier 311 is disposed within the TCA 306 for receiving the potentials V1 and V2 using a positive input port 311a and a negative input port 311b, respectively. Differential output signals from the second difference amplifier 311 are applied to a differential integrator circuit formed by resistors R4 324, R5 325, R6 326, R7 327 and capacitors C2 332 and C3 333, and a second OpAmp 312, as shown in FIG. 3. Resistors R4 324 and R6 326 are disposed between first and second output ports of the second differential amplifier 311 and negative and positive input ports, 312b and 312a, of the second OpAmp 312. An output port 312c of the second OpAmp 312 is connected to a base terminal of transistor Q3 343 for providing of a differential integrator output signal, in the form of a differential integrator output current, thereto.

A third feedback resistor 363 is disposed between the emitter terminal of the third transistor Q3 343 and the second supply voltage input port 300b. Preferably the resistance of the third feedback resistor 363 is selected to be approximately identical to that of the first feedback resistor 361 disposed within the TIA stage 303 and the second feedback resistor 362 disposed within the dummy TIA stage 304.

The emitter terminal of transistor Q3 343 is also coupled in series with resistor R7 327 and capacitor C2 332, disposed in parallel and coupled in series with the negative input port 312b of the second OpAmp 312. The differential integrator circuit output port 306c is formed from the collector terminal of transistor Q3 343 for providing a first current therefrom.

If a second gain of the second differential amplifier 311 is set to unity, and R4–R7=R and C2=C3=C, a transconductance gain of the TCA 306 is expressed in Equation (1):

$$a.\ I1 = \frac{1}{R_{F1}} \times \frac{V1 - V2}{1 + S * C * R} \quad (1)$$

Therefore the TCA output signal provides an output current I1 dependent upon the difference voltage (V1–V2) of the TIA output signal and the dummy TIA output signal, divided by an effective transimpedance gain, which is dependent upon the first feedback resistor 361 disposed with the TIA stage 303. S is the Laplace Operator showing the integration action determined by the time constant set by C*R.

A pole formed from resistor R1 321 and capacitor C1 331 of the filter circuit 308 performs filtering of a portion of noise in the TIA output signal. The collector terminal of transistor Q3 343 is connected to the collector terminal of transistor Q1 341, this results in an addition of currents I1 and I2, to form an added current. A second current mirror 313 is formed from P channel MOSFETs M1 351 and M2 352. Source terminals of MOSFETs M1 351 and M2 352 are connected to the first supply voltage input port 300a. A second current mirror input port 313a is connected to the collector terminal of transistor Q1 341 of the first current mirror and to the collector terminal of transistor Q3 343 of the third current source. The second current mirror input port 313a receives the added current, where within the second current mirror 313 this added current is provided to gate terminals of MOSFETs M1 351 and M2 352, as well as to the drain terminal of MOSFET M1 351. MOSFET M1 351 is disposed in a diode configuration. The drain terminal of MOSFET M2 352 forms the second current mirror output port 313b for providing of the RSSI signal therefrom. Typically, the drain current of MOSFET M1 351 is set to be equal to the drain current of MOSFET M2 352, or set to some multiple of the drain current of MOSFET M2 352.

Figure 4:
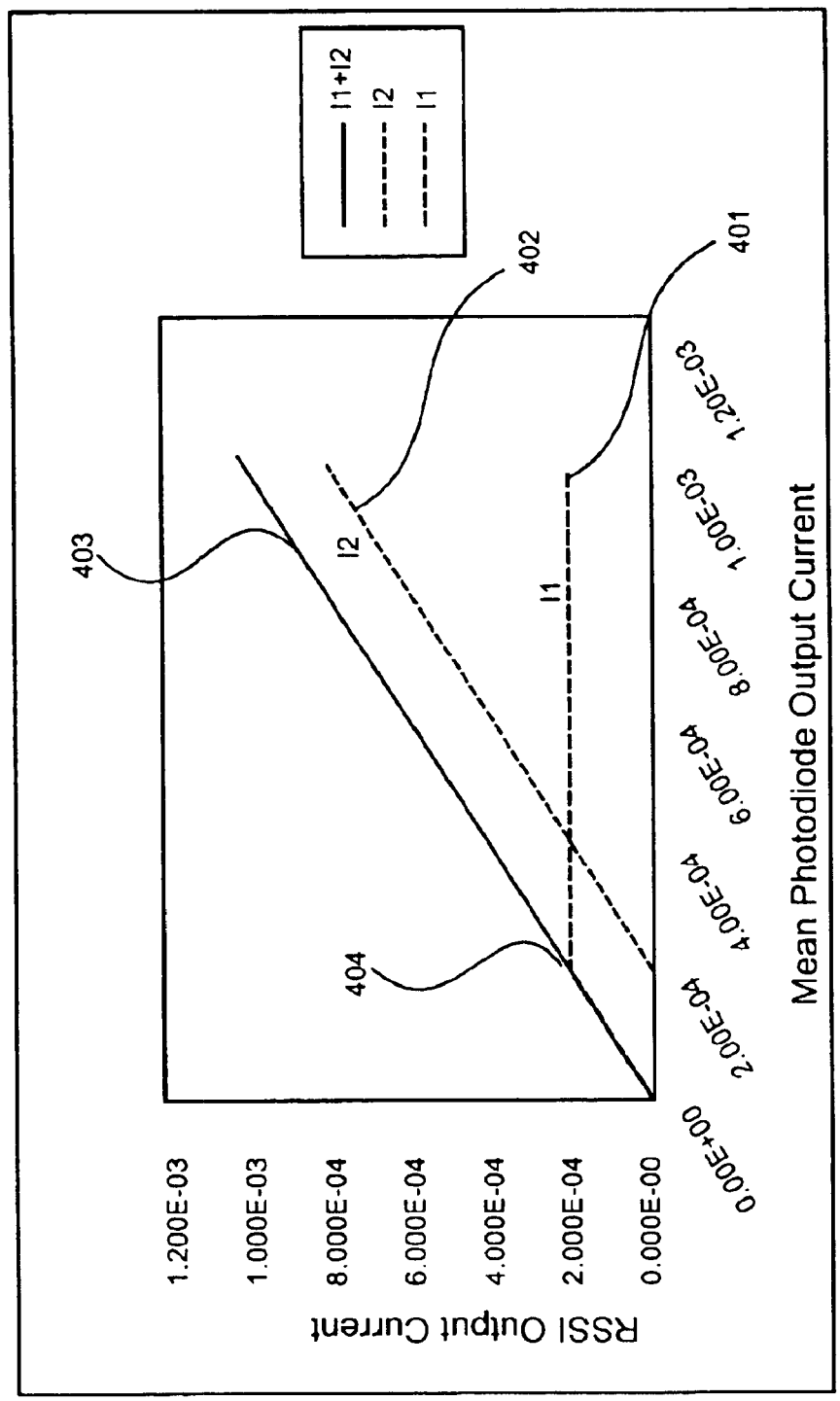

FIG. 4 graphically illustrates the RSSI output signal, in the form of RSSI output current, with respect to a mean photodiode output current. The second current (I2) 402 represents a DC restoration loop current for the collector terminal of transistor Q2 342. This second current (I2) 402 on its own does not represent the mean current flowing through the photodiode 307. The first bias signal (Vref) applied to the positive input port 310a of the first OpAmp 310 is used to provide the reference voltage (Vref), where this first bias signal (Vref) ensures that substantially no current flows from the TIA input port 303a until a threshold input current 404 provided to the TIA input port 303a is reached. FIG. 4 illustrates an exemplary threshold current 404 of 200 uA. Above this threshold current 404, I2 402 increases with increasing DC photodiode current. This ensures that the DC output voltage of the TIA output signal remains clamped. The current I1 401 operates between zero photodiode current, the sensitivity limit of the photodiode, up to the threshold current 404, as determined by first bias signal, since the current I2 402 is determined by the potential difference of V1–V2. Above the threshold current 404, I1 401 remains constant since the DC component of the TIA output signal is clamped, such that V1–V2=0. By adding the collector currents of transistors Q3 343 and Q1 341, the total current, I1+I2 represents the total mean current flowing through the photodiode 307 and into the TIA input port 303a.

Advantageously, when the circuit of FIG. 3 is utilized, the photodiode cathode is directly connected to the first supply voltage input port 300a and thus a maximum reverse bias voltage is provided to the photodiode 307. In addition, the circuit illustrated in FIG. 3 operates from a single ended 3.3V power supply (Vpos=3.3V) as opposed to requiring a dual Vpos power supply, as that which is utilized with the circuit of FIG. 1b. In addition, the circuit of FIG. 3 advantageously allows for an avalanche photodiode (APD) to be used therewith. When an APD is used, then the APD is advantageously operated from a separate power supply, if required. Thus an APD is useable in place of the photodiode without any hindrance to the fully integrated RSSI circuit, with the circuit still for providing the RSSI signal to the RSSI output port 313b thereof.

Advantageously, the fully integrated RSSI circuit utilizes a threshold current to ensure that the DC restoration loop does not cause a signal receiver sensitivity penalty due to a mismatch between the DC output voltage of the TIA stage 303 and dummy TIA stage 304. The TCA 306 provides the first current (I1) from zero photodiode current, the sensitivity limit of the photodiode, up to the threshold current 404 and is advantageously included within the fully integrated RSSI circuit.

Numerous other embodiments may be envisaged without departing from the spirit or scope of the invention.

What is claimed is:

1. A circuit for coupling to a photodetector for providing a received signal strength indicator (RSSI) signal comprising:

a transimpedance amplifier (TIA) stage coupled to the photodetector for receiving current flowing therethrough and for providing a TIA output signal;

a filter circuit having an input port for receiving the TIA output signal and for filtering the TIA output signal to provide a first voltage signal;

a dummy TIA stage having a dummy TIA output port for providing a second DC voltage signal;

a high gain integrator circuit having a negative input port for receiving the second DC voltage signal, having a positive input port for receiving the first voltage signal and having an output port for providing a high gain integrator output signal therefrom;

a transconductance amplifier (TCA) circuit having a negative input port for receiving the second DC voltage signal, having a positive input port for receiving the first voltage signal, and having an output port for providing a first current therefrom; and a second current mirror having an input port for receiving the first current and a second current and for providing the RSSI signal from an output port thereof, the RSSI signal dependent upon the first and second currents.

2. A circuit according to claim 1, wherein the high gain integrator circuit comprises a first difference amplifier having a negative input port for receiving the second DC voltage signal and a positive input port for receiving the first voltage signal, the first difference amplifier having an output port for providing a first differential amplifier output signal.

3. A circuit according to claim 2, wherein the high gain integrator circuit comprises an integrator circuit having a negative input port for receiving the first differential amplifier output signal, a positive input port for receiving a first bias signal and an output port for providing the high gain integrator output signal therefrom.

4. A circuit according to claim 3, wherein the high gain integrator circuit comprises:

a first operational amplifier having a negative input port for receiving the first differential amplifier output signal, a positive input port for receiving a first bias signal and an output port for providing the high gain integrator output signal therefrom; and, a fourth capacitor disposed between the output port and the negative input port.

5. A circuit according to claim 3, comprising a second transistor having a collector terminal coupled to the TIA input port and having a base terminal coupled to the high gain integrator output port for receiving the high gain integrator output signal therefrom.

6. A circuit according to claim 5, comprising an eighth resistor disposed between a second supply voltage input port and an emitter terminal of the second transistor.

7. A circuit according to claim 3, comprising a first current mirror for receiving the high gain integrator output signal and for providing the second current to the input port of the second current mirror.

8. A circuit according to claim 7, wherein the first current mirror comprises a first transistor having a base terminal coupled to the high gain integrator output port for receiving the high gain integrator output signal therefrom, the first transistor for providing the second current from a collector terminal thereof in dependence upon the high gain integrator output signal, the second current for being received by the input port of the second current mirror.

9. A circuit according to claim 8, comprising a ninth resistor disposed between a second supply voltage input port and an emitter terminal of the first transistor.

10. A circuit according to claim 1, wherein the transconductance amplifier (TCA) circuit comprises a second difference amplifier having a negative input port for receiving the second DC voltage signal and a positive input port for receiving the first voltage signal, the first difference amplifier having first and second output ports for providing second differential amplifier output signals therefrom.

11. A circuit according to claim 10, wherein the transconductance amplifier (TCA) circuit comprises a differential integrator circuit for providing a differential integrator output signal.

12. A circuit according to claim 11, wherein the transconductance amplifier (TCA) circuit comprises a third transistor for receiving of the differential integrator output signal at a base terminal and for providing the first current from a collector terminal thereof, the first current for being received by the input port of the second current mirror.

13. A circuit according to claim 12, wherein the differential integrator circuit comprises:

a second operational amplifier having a positive input port and a negative input port and an output port;

a fourth resistor disposed between the negative input port of the of the second operational amplifier and a first output port of the second difference amplifier;

a fifth resistor disposed between the positive input port of the of the second operational amplifier and a second output port of the second difference amplifier;

a seventh resistor disposed between the emitter terminal of the third transistor and the negative input port of the second operational amplifier; and, a second capacitor disposed in parallel with the seventh resistor.

14. A circuit according to claim 1, wherein the filter circuit comprises a first resistor disposed between the TIA output port and the negative input port of the high gain integrator circuit.

15. A circuit according to claim 1, wherein the filter circuit comprises a first capacitor disposed between the negative input port of the high gain integrator circuit and a second voltage supply input port.

16. A circuit according to claim 14, comprising a second resistor disposed between the dummy TIA output port and the negative input port of the high gain integrator for propagating of the second DC voltage signal.

17. A circuit according to claim 16, wherein the first resistor and the second resistor have substantially equal resistances.

18. A circuit according to claim 12, wherein the TIA stage comprises a first feedback resistor disposed between the TIA output port and the TIA input port.

19. A circuit according to claim 18, wherein the TIA stage comprises a second feedback resistor disposed between the dummy TIA output port and the dummy TIA input port.

20. A circuit according to claim 19, wherein the transconductance amplifier (TCA) circuit comprises a third feedback resistor disposed between the emitter terminal of the third transistor and a second voltage supply input port.

21. A circuit according to claim 20, wherein the resistances of the first resistor, the second resistor, and the third resistor are substantially the same.

22. A circuit according to claim 1, comprising a first voltage input port, where the first voltage input port is for receiving a positive input voltage and where the TIA comprises a positive supply voltage input port for receiving of the positive input voltage, the same positive input voltage for biasing of the photodetector and the second current mirror.

23. A circuit according to claim 1, wherein the photodetector is a PIN diode.

24. A circuit according to claim 1, wherein the photodetector is an avalanche photodiode (APD).

25. A circuit according to claim 24, comprising:

a first voltage input port, where the first voltage input port is for receiving a first positive input voltage and where the TIA comprises a positive supply voltage input port for receiving of the first positive input voltage; and, a third voltage input port, where the third voltage input port is for receiving a second positive input voltage that is of a higher potential than the first positive input voltage, the second positive input voltage for biasing of the APD and the second current mirror.

26. A method of providing a RSSI signal from a circuit coupled to a photodiode comprising the steps of:

propagating a photodiode current through the photodiode;

providing a transimpedance amplifier (TIA) circuit for providing of a TIA output signal in dependence upon receiving of the photodiode current from the photodiode;

adjusting a first bias voltage;

providing a first current in dependence upon the photodiode current and the first bias voltage;

providing a second current in dependence upon the photodiode current and the first bias voltage; and, summing the first and second currents to provide an added current, where the RSSI signal is dependent thereon.

27. A method according to claim 26, wherein the step of adjusting the first bias voltage comprises the step of providing a threshold current.

28. A method according to claim 27, wherein the RSSI signal is substantially dependent upon the first current up to a point where the added current reaches the threshold current.

29. A method according to claim 27, wherein the RSSI signal is substantially dependent upon the second current after a point where the added current exceeds the threshold current.

30. A method according to claim 26, wherein once the added current exceeds the threshold current, the first current is approximately constant with increasing photodiode current.

31. A method according to claim 26, wherein once the added current exceeds the threshold current, the second current increases approximately linearly with the increasing photodiode current.

32. A method according to claim 26, comprising the step of other than lowering a reverse bias voltage available to the photodiode when the photodiode is biased with a single ended positive voltage supply and the same single ended positive voltage supply is used for providing a positive supply voltage to the TIA circuit.

33. A method according to claim 30, wherein the step of providing the first current, comprises the steps of:

filtering of the TIA output signal to obtain the DC component of the TIA output signal in a filtered signal;

receiving a dummy TIA output signal;

differentially amplifying the dummy TIA output signal and the filtered signal;

integrating the differentially amplified signal to form a high gain integrator output signal; and, current mirroring the high gain integrator output signal to form the first current.

34. A method according to claim 33, wherein the step of filtering comprises the step of low pass filtering to remove a portion of the noise in the TIA output signal.

35. A method according to claim 30, wherein the step of providing the second current, comprises the steps of:

filtering of the TIA output signal to obtain the DC component of the TIA output signal in a filtered signal;

receiving a dummy TIA output signal;

differentially amplifying the dummy TIA output signal and the filtered signal;

differentially integrating the differentially amplified signal to form a differential integrator output signal; and, current mirroring the differential integrator output signal to form the second current.

36. A method according to claim 35, wherein the step of filtering comprises the step of low pass filtering to remove a portion of the noise in the TIA output signal.

* * * * *